United States Patent [19]

Murata et al.

[11] Patent Number: 4,777,117
[45] Date of Patent: Oct. 11, 1988

[54] PROCESS FOR PRODUCING COLOR FILTER USING ALIGNMENT MARKS

[75] Inventors: Tatsuo Murata; Masaru Kamio, both of Atsugi; Hideaki Takao; Taiko Motoi, both of Sagamihara; Eiji Sakamoto, Hiratsuka; Nobuyuki Sekimura, Kawasaki, all of Japan

[73] Assignee: Canon Kabushiki Kaisha, Tokyo, Japan

[21] Appl. No.: 924,737

[22] Filed: Oct. 30, 1986

[30] Foreign Application Priority Data

Nov. 6, 1985 [JP] Japan .................. 60-246999

[51] Int. Cl.⁴ .................................................. G03C 5/00
[52] U.S. Cl. ........................................ 430/293; 430/7; 430/22
[58] Field of Search ............................. 430/7, 22, 293

[56] References Cited

U.S. PATENT DOCUMENTS

| 4,343,878 | 8/1982 | Chiang ................... | 430/22 |
| 4,423,127 | 12/1983 | Fujimura ............... | 430/22 |
| 4,482,625 | 11/1984 | Namiki et al. ........ | 430/293 |
| 4,522,903 | 6/1985 | Heiart et al. .......... | 430/22 |
| 4,536,420 | 8/1985 | Amendola et al. ... | 430/22 |
| 4,564,584 | 1/1986 | Fredericks et al. ... | 430/22 |

*Primary Examiner*—Jack P. Brammer
*Attorney, Agent, or Firm*—Fitzpatrick, Cella, Harper & Scinto

[57] ABSTRACT

A process for producing a color filter having plural number of colorant layer patterns by repeating, for each of a plural number of starting materials for colorant layer, the steps of subjecting a substrate having a photo-resist laminated thereon to pattern exposure to effect patterning of said photo-resist, laminating a colorant layer from said photoresist above and removing the layer of said photoresist having said colorant layer laminated thereon by dissolution to form a colorant layer pattern, comprises forming an alignment mark on said substrate with the same starting material as a first colorant layer pattern simultaneously with formation of said first colorant layer pattern and performing registration of the mask during formation of a second colorant layer pattern et seq. through said alignment mark.

7 Claims, 5 Drawing Sheets

PROCESS FOR PRODUCING COLOR FILTER USING ALIGNMENT MARKS

BACKGROUND OF THE INVENTION

1. Field of the Invention

This invention relates to a process for producing a color filter which can be used in color solid state image pick-up devices, contact type image sensors and color displays such as CCD (charge coupled device), BBD (bucket brigade device,), CID (charge injection device), BASIS (base store type image sensor), etc.

2. Related Backgroud Art

As a color filter, there has been known a dyed color filter which is prepared by providing a mordant layer comprising a hydrophilic polymeric material on a substrate and dyeing the mordant layer with a dye to provide a colored layer. However, this kind of color filter has the following disadvantages:

(1) A mordant layer is required.

(2) An intermediate layer for prevention of staining is required to be provided on the mordant layer for preventing the adjacent colorant layers from color mixing.

(3) Since color formation is effected by dyeing of the mordant layer, the thickness of the layer is necessarily required to be thick.

(4) Dyeing with a dye is susceptible to fading on account of insufficient humidity resistance, light resistance of the colored layer.

As a color filter of another system free from these disadvantages, there is one in which the colorant layer is formed, for example, as the vapor deposited thin film of a colorant by vacuum vapor deposition. As a method for producing this kind of color filter, the so called reverse etching method (or the lift-off method), which comprises forming a dissolvable photoresist pattern on a substrate, then forming a colorant layer, subsequently removing the dissolvable resist pattern therebeneath by dissolution, thereby liberating off the unnecessary colorant layer formed as the upper layer thereon at the same time, has been known as disclosed in Japanese Patent Publication No. 16815/1972. According to the reverse etching method, after a pattern resist which is negative relative to the colorant layer of a desired shape has been provided by use of a material dissolvable layer, primarily a positive-type resist, a colorant layer is provided according to, for example, the vacuum vapor deposition method, followed by dissolution of the resist pattern of the lower layer, to provide a colored pattern of a desired shape. According to this method, since a colored pattern consisting only of a colorant layer can be obtained, the constitution can be advantageously simple.

The method for formation of a color filter comprising the three colors of blue, green and red by the reverse etching method is outlined below by referring to FIGS. 9A–9D.

A substrate 1 is coated with a photosensitive resin (photoresist) 2 thereon and, by use of a mask having a light-transmitting portion of a desired shape, the photoresist 2 laminated on the substrate 1 is subjected to pattern exposure, and a photoresist pattern of a desired shape is formed by dissolving the exposed portion (when the photoresist is a positive-type). This state is shown as a schematic sectional view in FIG. 9A. FIG. 9B shows the state in which a blue colorant layer 3 is provided on the whole surface according to the vacuum vapor deposition method, etc. Subsequently, when the resist pattern 2 remaining on the substrate 1 is dissolved with a removing liquid, the colorant layer on the resist pattern 2 is also liberated off to give a blue colorant layer pattern 4 as shown in FIG. 9C.

By repeating the above steps for the colorants of green and red, a color filter having the tricolor colorant layer patterns 4, 5 and 6 as shown in FIG. 9D can be formed.

Exposure in the steps of forming the respective colorant layer patterns is effected generally after moving horizontally the one mask as described above to a desired position. Accordingly, as shown in FIG. 10, the alignment mark 7a of the mask 7 is required to be coincident with the alignment mark 1a marked on the substrate 1 before practicing every exposure, and therefore a plural number of alignment marks 1a is required to be marked on the substrate 1.

Since the alignment marks 1a on the substrate 1 are required to be marked with high positional precision, they have been conventionally formed according to the dry etching method. This dry etching method is shown in FIGS. 11A–11D. First, on the substrate 1, a metal layer 8 such as of Al, Cr, etc. is formed by vapor deposition (FIG. 11A), and after coating of a photoresist 2 on the whole surface thereof (FIG. 11B), patterning of said photoresist 2 is effected and a portion of the metal layer 8 not covered with the resist pattern 2a is subjected to dry etching (FIG. 11C), and thereafter the resist pattern 2a on the remaining metal layer 8 is removed to mark the desired alignment mark 1a (FIG. 11D).

By formation of alignment marks in this manner, the following problems will ensue.

1. A metal is first vapor deposited to the broad area of the substrate 1, and then unnecessary portion of the metal is removed. Therefore, the unnecessary portion of the vapor deposited metal cannot be completely dry etched to leave attached matters to remain on the substrate and, when a colorant layer is laminated thereon, adhesion between the colorant layer and the substrate is worsened to result in peel-off of the colorant and give rise to appearance defects, thus causing lowering in yield.

2. Since a metal alignment mark is required to be formed previously before vapor deposition of a colorant layer, enormous amounts material cost, installation cost and labor are needed for preparation of metal alignment mark, and the production cost of a color filter is increased.

SUMMARY OF THE INVENTION

The present invention has been accomplished in order to remove the drawbacks of the prior art example as described above, and its object is to provide a process for producing a color filter which can determine the appropriate positions of the respective colorant layer patterns at high precision without previous forming of an alignment mark comprising a metal layer, to effect consequently reduction in appearance defect and lowering in cost According to the present invention, there is provided a process for producing a color filter having a plural number of colorant layer patterns by repeating, for each of a plural number of starting materials for colorant layers, the steps of subjecting a substrte having a photoresist laminated thereon to pattern exposure to effect patterning of said photo-resist, laminating a colorant layer from said photoresist above an removing the layer of said photoresist having said colorant layer laminated thereon by dissolution to form a colorant layer pattern, which comprises forming an alignment mark on said substrate with the same starting material as a first colorant layer pattern simultaneously with formation of said first colorant layer pattern and performing registration of the mask during formation of a second colorant layer pattern et seq. through said alignment mark.

DESCRIPTION OF THE PREFERRED EMBODIMENTS

Figure 1:
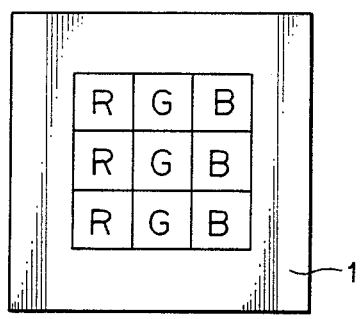
FIG. 1 is a schematic plane view of a color filter prepared according to an embodiment of the present invention.

Referring now to an embodiment wherein a color filter having the colorant layer patterns of blue, green and red (in the Figure, they are represented by B, G and R, respectively: also the same in other Figures) arranged on a substrate 1, as shown in FIG. 1, is prepared, the present invention is described in detail.

Figure 2:
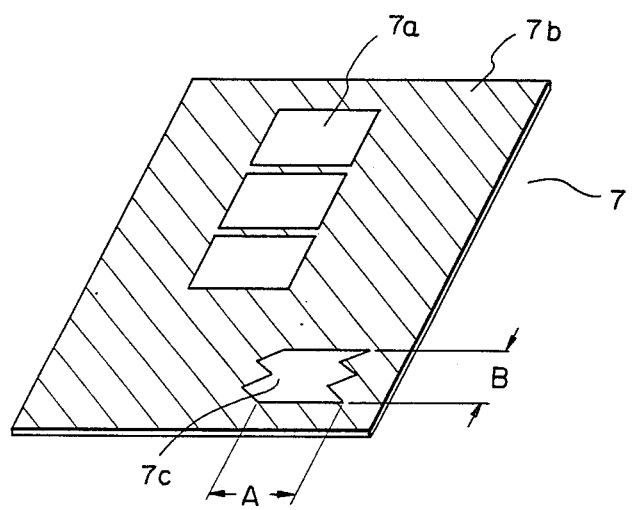
FIG. 2 is a perspective view of the mask used in said embodiment.

The mask used in this embodiment is shown in FIG. 2. The mask 7 is provided with a light-transmitting portion 7a to determine the shape of the colorant layer pattern and a light-transmitting portion 7c to form an alignment mark for determining the shape of an alignment mark, within a light-intercepting portion 7b. The light-transmitting portion 7c for forming an alignment mark is formed at the position not to affect the colorant layer pattern. In the example shown in FIG. 2, the light-transmitting portions 7a are formed in a row perpendicularly to the direction of moving the mask. Said light-transmitting portion 7c for formation of alignment mark is explained as only one for the purpose of convenience. In the claims, "light-transmitting portion or light-intercepting portion for formation of alignment mark" is referred to, but the light-transmitting portion is given when using a positive-type resist or the light-intercepting portion is given when using a negative-type resist.

In this embodiment, first a continuous photoresist layer is applied at a predetermined portion on the substrate 1 such as of a glass, a plastic, etc. Since the mask 7 shown in FIG. 2 is employed, explanation is made about the case when employing a positive-type resist as the photoresist, but a negative-type resist can also be used and the present invention can be practiced by referring to this embodiment also in that case.

Next, the mask 7 shown in FIG. 2 is arranged at a predetermined position above the substrate 1 having the photoresist formed thereon. For determination of the position of the mask 7 relative to the substrate 1, a marker for registration for a substrate may be prepared on the mask 7 and registration may be effected following that mark.

The photoresist is required to be coated in the preceding step so that the photoresist may exist below not only the light-transmitting portion 7a but also the light-transmitting portion 7c for formation of an alignment mark when the position of the mask 7 is thus determined.

Figure 3:
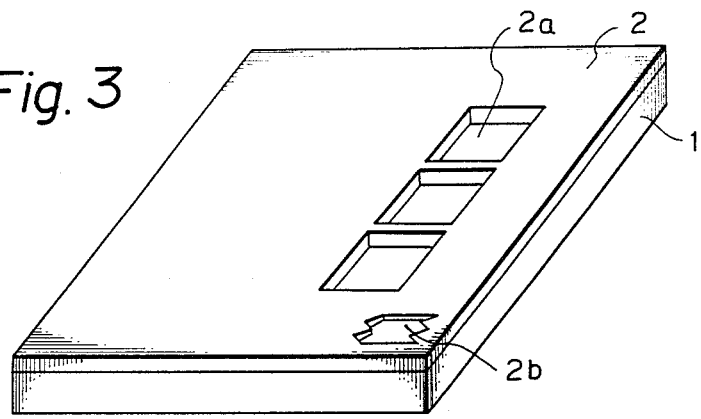
FIGS. 3 and 4 each show one step of said embodiment.

Sbsequently, the photoresist on the substrate 1 is subjected to exposure through the mask 7, and then the exposed portion is removed by dissolving with a developer capable of dissolving only that portion to form an opening portion 2a corresponding to the light-transmitting portion 7a in the photoresist 2 simultaneously with removal of the photoresist at the portion where light is irradiated through the light-transmitting portion 7c for formation of an alignment mark to form an opening portion 2b corresponding to the light-transmitting portion 7c, as shown in FIG. 3. Then, a first colorant layer (e.g. a blue colorant layer) is laminated to a substantially uniform thickness on the surface of the remaining photoresist 2 and the surface of the substrate 1 exposed through the opening portions 2a, 2b where the photoresist is removed. This lamination may be practiced by utilizing typically the vacuum vapor deposition method, or otherwise the coating method, the printing method, the dipping method, etc.

Figure 4:
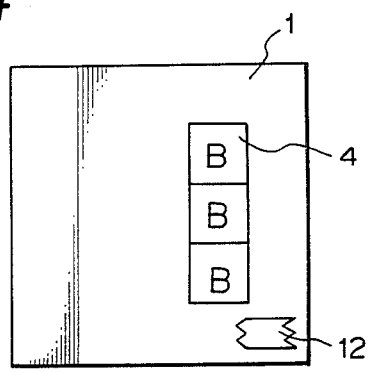

Thereafter, the resist pattern 2 is dissolved. By this operation, the unnecessary portion of the colorant layer on the pattern is removed at the same time to form a first colorant layer pattern 4 on the substrate 1 as shown in FIG. 4. At the same time, an alignment mark 12 having the same shape as the light-transmitting portion 7c for formation of an alignment mark is formed of the same colorant layer as the colorant layer pattern 4 on the substrate 1 (step 1).

Figure 5:
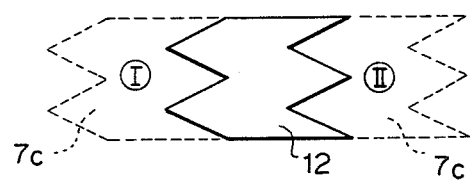
FIG. 5 is a plane view showing relationship between an alignment mark and a light-transmitting portion for formation of an alignment mark.

Next, by repeating the above step except for changing only the colorant layer starting material, a second colorant layer pattern is formed (step 2). During exposure for the photoresist in this step 2, precise registration of the mask 7 can be done with extreme ease by using the alignment mark 12, provided that the width "A" of the light-transmitting portion 7c of the mask 7 for formation of an alignment mark (FIG. 2) is previously formed so as to be the same as the horizontal movement width of the mask 7 from the step 1 to the step 2, by permitting the W-shaped side on the right end of the light-transmitting portion 7c for formation of an alignment mark to be coincident with the W-shaped side on the left end of the alignment mark 12 formed on the substrate 1 as shown in FIG. 5 (state I). Thus, a second colorant layer pattern (in FIG. 1, R colorant layer) is formed in the neighborhood on the lift of the first colorant layer patter 4 (B colorant layer pattern).

Further, by repeating the same step as the step 2 for a third colorant, a third colorant layer pattern (in FIG. 1, G colorant layer pattern) is formed (step 3). In the step 3, the mask registration practiced by permitting the W-shaped side on the left end of the light-transmitting portion 7c to be coincident with the W-shaped side on the right end of the alignment mark 12 (the state II in FIG. 5). In this way, R, G, and B colorant layer patterns are formed as shown in FIG. 1.

Further, it is necessary to coat a photoresist on the substrate 1 at the initial stage of step 2. However, at the time of coating, even if the photoresist is coated even onto a first alignment mark 12 to cover over said mark 12, said mark can be seen through the layer of photoresist, whereby there is no trouble involved in registration of the mask in the step 2.

According to the steps 1 to 3 as described above, without previous formation of a metal alignment mark, a color filter shown in FIG. 1 without positional deviation of the respective colorant layers can be formed.

Figure 6:
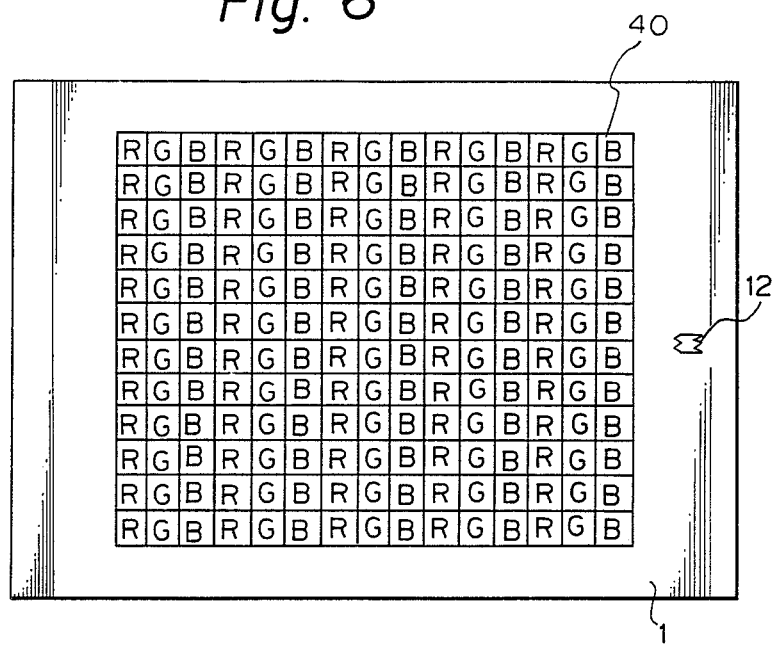
FIG. 6 is a schematic plane view of a color filter prepared according to another embodiment of the present invention.

Further, the color filter is composed of a set or combination of many colorant layers 40 as shown in FIG. 6 (in FIG. 1, the number of the colorant layer is only 9). For example, the size of one colorant layer 40 is 200 $\mu m \times 200$ $\mu m$. The colorant layers 40 of this size (B, G, R) are formed in the area of, for example, A4 size. In the case of the stripe filter as shown in FIG. 6, a row of, for example, "B" colorant layer 40 is repeatedly formed (This is applicable to the rows of the "G" and "R" colorant layers). This type of color filter cannot be prepared with high efficiency by using the mask having only one row of the light-intercepting portion 7a as shown in FIG. 2. When such a color filter as shown in FIG. 6 is to be produced, a plurality of rows of the light-intercepting portions 7a may be provided so that colorant layers of the same color may be formed at the same time. In this way, when the colorant layers to be formed are three kinds of B, G, and R, a color filter can be produced with high efficiency by the step 1 through step 3 as mentioned above.

When the horizontal movement width of the mask is not the same, there may be employed a mask having a plural number of light-transmitting portions for formation of alignment marks having different widths provided at appropriate positions or a plural number of masks having light-transmitting portions for formation of alignment marks with different widths.

Figure 7:
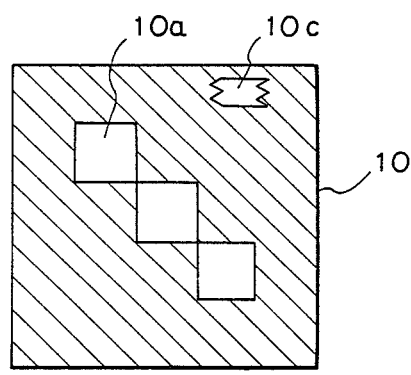
FIG. 7 is a plane view showing another example of the mask to be used in another embodiment of the present invention.
Figure 8:
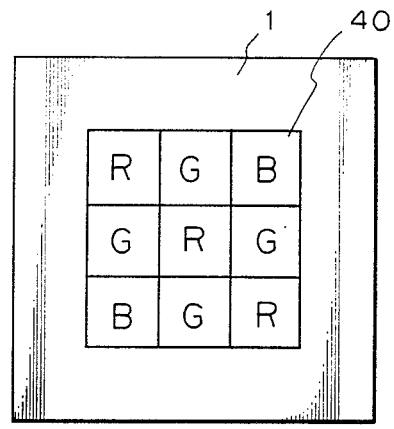
FIG. 8 is a schematic plane view of the color filter prepared by said embodiment.
Figure 9A:
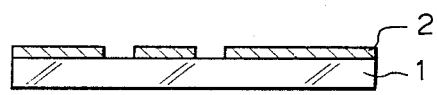
FIGS. 9A-9D are sectional views showing the steps of the process for producing a color filter according to the reverse etching method.
Figure 9B:
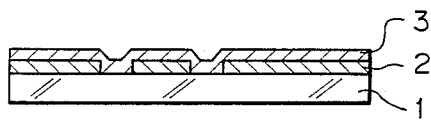
Figure 9C:
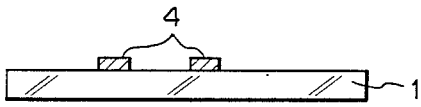
Figure 9D:
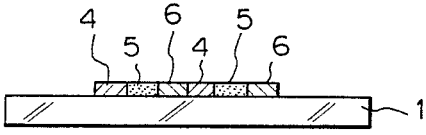
Figure 10:
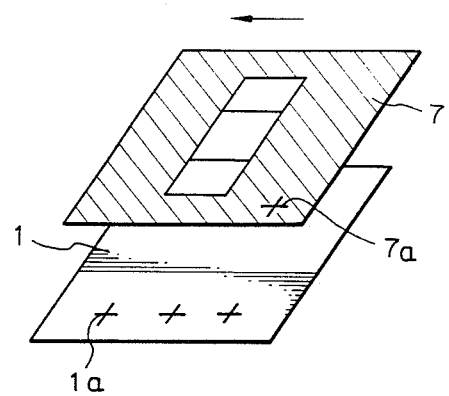
FIG. 10 is a perspective view showing one step of the conventional process for producing a color filter.
Figure 11A:
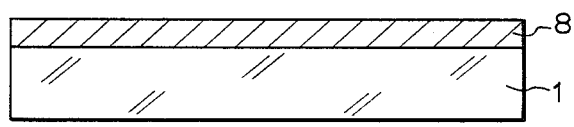
FIGS. 11A-11D are sectional views showing an example of the method for preparing a metal alignment mark.
Figure 11B:
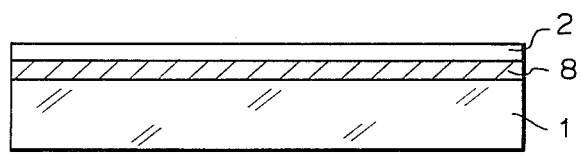
Figure 11C:
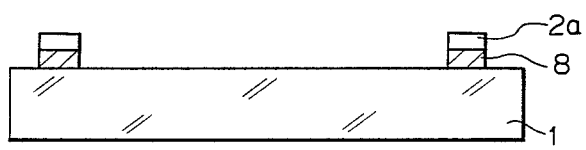
Figure 11D:
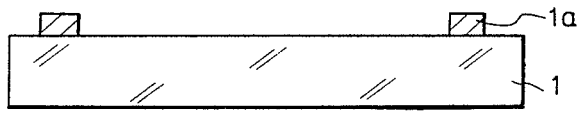

The number of the light-transmitting portions of the mask, individual shapes thereof, the pattern shapes of the plural number of the light-transmitting portions and the number of kinds of the colorant layers may be used as desired. For example, by use of a mask having a light-transmitting portion 10c for formation of an alignment mark and light-transmitting portions 10a formed in the oblique direction relative to the movement direction of the mask as shown in FIG. 7, a color filter having a colorant layer pattern as shown in FIG. 8 can be prepared. The row of the light-intercepting portions 10a obliquely formed may be made in a plurality of rows.

As described in detail above, according to the present invention, it has become possible to prepare a color filter without positional deviation in the respective colorant layer patterns even without formation of alignment mark comprising a metal layer. As the result, the following effects can be obtained.

1. By omitting the operation of formation of a metal alignment mark, no attached matter remains on the substrate surface to result in no reduction of adhesion between the colorant and the glass, whereby generation of appearance defect of the color filter is reduced.

2. Because of saving of the material cost, instrument and labor necessary for formation of metal alignment mark, it has become possible to lower the production cost of the color filter to a great extent.

EXAMPLE

By use of a mask having 50,000 light-transmitting portions 7a and one light-transmitting portion 7c for formation of an alignment mark, a stripe color filter as shown in FIG. 6 was prepared in accordance with the present invention. The shape of the light-transmitting portion 7a was a square of 300 $\mu m \times 300$ $\mu m$. One row of the light-transmitting portions was composed of 500 light-transmitting portions 7a of 300 $\mu m \times 300$ $\mu m$, and such row was provided in 100 rows in the mask. The shape of the light-transmitting portion 7c for formation of alignment mark was the same as that shown in FIG. 2, and the width "A" was 300 $\mu m$ and the width "B" 150 $\mu m$.

On a glass substrate, a positive-type resist (trade name: OFPR 800, produced by Tokyo Oka) was applied to a film thickness of 8000 Å so as to form a continuous surface. After prebaking treatment at 90° C. for 30 minutes, pattern exposure was effected with a UV-ray by use of the above mask. This was immersed in a developer for exclusive use in OFPR and a rinsing solution for exclusive use in OFPR continuously each for one minute to form a resist pattern. At the same time, the photoresist at the portion where light was irradiated through the light-transmitting portion for formation of an alignment mark was removed.

Subsequently, the above glass substrate having the resist pattern formed thereon and copper phthalocyanine filled in a Mo boat were placed in a vacuum vessel, and the Mo boat was heated to 450° C.–550° C. at a vacuum degree of $10^{-5}$–$10^{-6}$ Torr to effect vapor deposition of copper phthalocyanine. The film thickness was made 4000 Å. Then, the resist pattern was dissolved by dipping under stirring in a developer for exclusive use in OFPR simultaneously with removal of unnecessary portions of the vapor doposited film, thereby forming a blue colorant layer pattern and an alignment mark comprising a colorant layer for registration.

Subsequently, the glass substrate having the blue colorant layer pattern formed thereon was coated with OFPR 800, and the position of the mask was determined by permitting the end portions of the alignment mark comprising the colorant layer on the substrate and the light-transmitting portion for formation of alignment mark of the mask to coincide with each other, followed by the same steps as described above to form a green colorant layer pattern of copper phthalocyanine. The film thickness was made about 4000 Å.

According to the same steps, a red colorant layer pattern was obtained by use of Irgadine Red BPT (trade name: produced by Ciba-Geigy, CI No. 71127), Thus, a stripe color filter comprising three of red, green and blue was obtained.

The color filter thus obtained was free from deviation between the respective colorant layers and defect in appearance, and it could also be prepared very easily and at low cost.

We claim:

1. A process for producing a color filter having a plurality of colorant layers comprising the steps:
    (1) laminating a photoresist layer on a substrate;
    (2) subjecting said photoresist layer to a pattern exposure with a mask having light-transmitting portions or light-intercepting portions for defining a colorant layer pattern and an alignment mark pattern separate from said colorant layer pattern, thereby forming corresponding patterns in said photoresist layer;

(3) removing the portion of the photoresist layer corresponding to said patterns from the substrate, thereby exposing the substrate beneath said patterns;

(4) laminating one of a plurality of colorants over the remaining portion of the photoresist and over the exposed substrate;

(5) removing the remaining portion of the photoresist and colorant laminated thereon, thereby forming a colorant layer pattern and a colorant alignment mark pattern on said substrate;

(6) repeating steps (1) to (5) for each of the other colorants of said plurality of colorants, wherein said alignment mark pattern defined in said mask is aligned adjacent to the preceding colorant alignment mark pattern on said substrate.

2. A process according to claim 1, wherein said photoresist layer is a positive type resist.

3. A process according to claim 1, wherein said mask has one row of the light-transmitting portions for formation of colorant layer patterns in the direction perpendicular to the movement direction of said mask.

4. A process according to claim 1, wherein said mask has a plurality of rows of the light-intercepting portions.

5. A process according to claim 1, wherein said mask has one row of light-transmitting portions for formation of a colorant layer pattern arranged slantwise relative to the movement direction of the mask.

6. A process according to claim 1, wherein said mask has a plurality of rows of the light-transmitting portions.

7. A process according to claim 1, wherein said plurality of patterned colorant layers are a blue colorant layer, a red colorant layer and a green colorant layer.

* * * * *